United States Patent [19]

Nikkel

[11] Patent Number: 4,758,863

[45] Date of Patent: Jul. 19, 1988

[54] MULTI-IMAGE RETICLE

[75] Inventor: Philip G. Nikkel, Loveland, Colo.

[73] Assignee: Hewlett-Packard Company, Palo Alto, Calif.

[21] Appl. No.: 14,955

[22] Filed: Feb. 17, 1987

[51] Int. Cl.⁴ ............................................. G03B 27/52
[52] U.S. Cl. ......................................... 355/40; 355/53
[58] Field of Search .................. 355/40, 53, 75, 125; 354/15

[56] References Cited

U.S. PATENT DOCUMENTS 3,677,146  7/1972  Nielsen ........................... 355/39 X
4,603,968  8/1986  Munnig Schmidt ................. 355/75

Primary Examiner—Richard A. Wintercorn
Attorney, Agent, or Firm—S. A. Kassatly; Bloor Redding, Jr.

[57] ABSTRACT

A multi-level reticle is described which comprises a multiplicity of integrated circuit mask patterns. The mask patterns are positioned in separate areas on the reticle.

The reticle is adapted to be positioned in a projection stepper apparatus for projection of light through one of the areas of the reticle to project a mask pattern onto a substrate (e.g. a wafer) to form an image. The reticle is also adapted to be rotated about its center in a manner such that each of the other mask patterns on the reticle can be projected onto the substrate in registration with the image formed from projection of the first mask pattern onto the substrate. Typically the separate mask patterns are located in separate quadrants on the reticle when there are three or four mask patterns. When there are only two mask patterns, typically they are located in separate hemispheres on the reticle. By having multiple mask patterns on the same reticle, in separate areas on the reticle, it is possible to rotate the reticle in the projection stepper apparatus so that each mask pattern image projected is in registry with the images projected by the other mask patterns onto a wafer.

15 Claims, 4 Drawing Sheets

MULTI-IMAGE RETICLE

FIELD OF THE INVENTION

This invention relates to photolithography. More particularly, this invention relates to processing techniques for production of integrated circuits. Even more particularly, this invention relates to reticles used in the production of integrated circuits.

BACKGROUND OF THE INVENTION

Conventional integrated circuit production utilizes photolithography techniques to define a print on a wafer. Successive film photolithography and film growth or deposition creates a completed integrated circuit with many identical copies on the same wafer. Each copy is known as a die.

As integrated circuits have become smaller in size, the photolithographic process requires more sophistication in the alignment techniques and the resolution. Presently, photolithography processes utilize an instrument which steps and repeats in a manner such that the wafer is properly aligned, then a portion of it is exposed to the desired image from the appropriate photomask, then the wafer is stepped and aligned, after which the wafer is again exposed to the appropriate photomask.

This step and repeat alignment process utilizes a master image called a reticle. The image of the reticle is focussed through a lens onto a portion of the wafer.

Initially, individual reticles had only one die image on them. Therefore, it was necessary to step, align, and expose for each die on a wafer. Later, multiple dies were included on a single reticle, thereby allowing the exposure of many dies at a time. This reduced the number of steps, alignments, and exposures required for each wafer. Consequently, this procedure increased the capacity of each such instrument.

Such a system and process requires a separate reticle for each photolithographic step (i.e. for each mask level). Each time an instrument is changed to a different mask level the reticle must be changed. In other words, a new reticle must be procured for each photolithographic step. Reticles must be made under exacting conditions and are relatively expensive for use in making phototype wafers and other low volume production quantities (i.e. 25 to 5000 wafers).

BRIEF DESCRIPTION OF THE DRAWINGS

The invention is described in more detail hereinafter with reference to the accompanying drawings, wherein like reference characters refer to the same parts throughout the several views and in which.

SUMMARY OF THE PRESENT INVENTION

In accordance with the present invention there are provided improved techniques for imaging of wafers in the production of integrated circuits. The improved techniques utilize a novel multi-level reticle comprising a multiplicity of integrated circuit mask patterns which are located in separate areas on the reticle (e.g. in separate quadrants).

The reticle is adapted to be received in a conventional projection stepper apparatus for projection of light through one of the pattern areas of the reticle to project a mask pattern onto a substrate such as a wafer. Then the reticle can be rotated about its center so that another of the mask patterns is placed in proper position for projection of light through another mask pattern onto the substrate.

The several mask patterns on the reticle are positioned such that they will project registering images on a substrate when the reticle is rotated about its center. In this manner a single reticle provides multiple image patterns (i.e. multiple levels) so that an integrated circuit may be produced having various levels of circuitry.

Because the reticle includes multiple image patterns in properly spaced relationship, rotation of the reticle about its center enables the various image patterns to be aligned with the projection stepper apparatus so that each image pattern will be in proper registration with he other mask image patterns projected from the same reticle. Also, each integrated circuit mask pattern is projected through the same portion of the lens in the projection apparatus. Thus, the techniques of this invention eliminated the lens distortion effects which would otherwise result from exposure of various mask image patterns through different parts of a lens.

The techniques of this invention also reduce mask costs because multiple image patterns can be located on the same reticle. The reticle design of the invention eliminates additional mis-registration of image patterns on a substrate. Significant cost savings are achieved for low volumes of wafers to be imaged.

Other advantages of the techniques and systems of the present invention will be apparent from the following description.

DETAILED DESCRIPTION OF THE INVENTION

Figure 1:
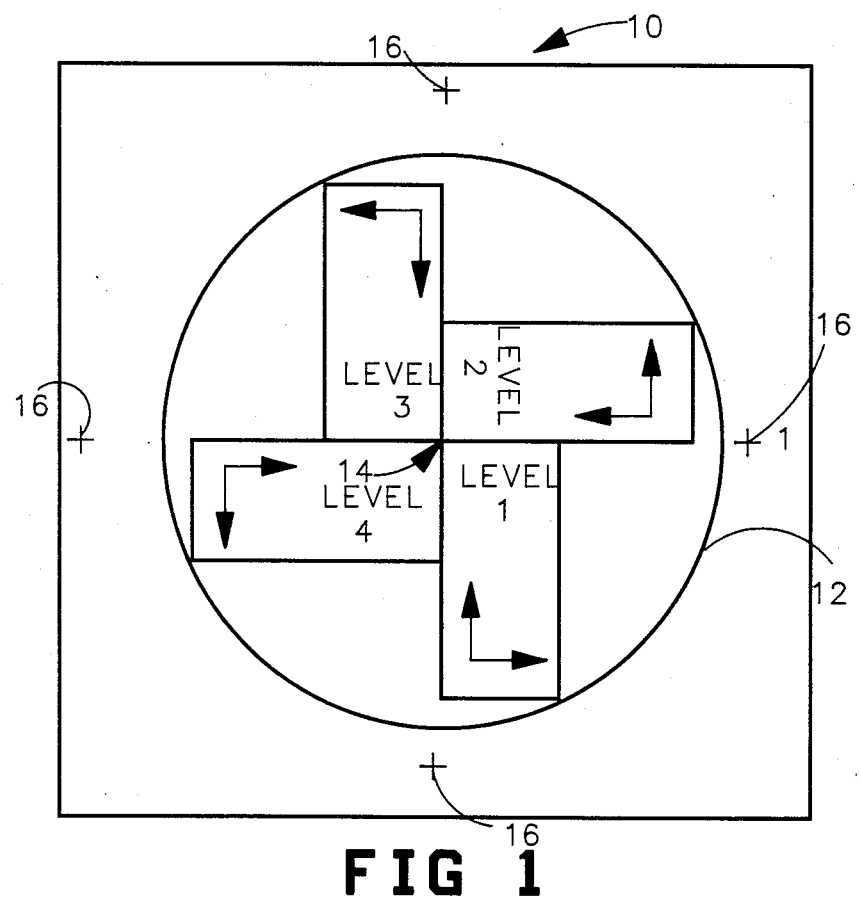
FIG. 1 is a plan view of one embodiment of multi-image reticle of this invention.
Figure 2:
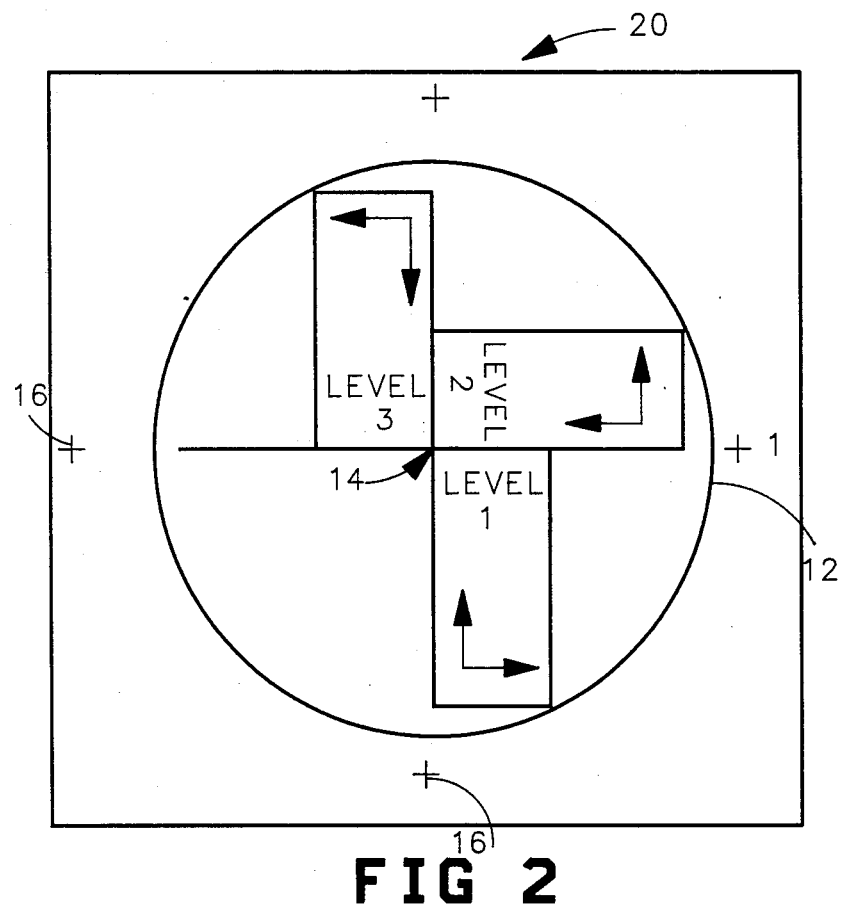
FIG. 2 is a plan view of another embodiment of multi-image reticle of this invention.
Figure 3:
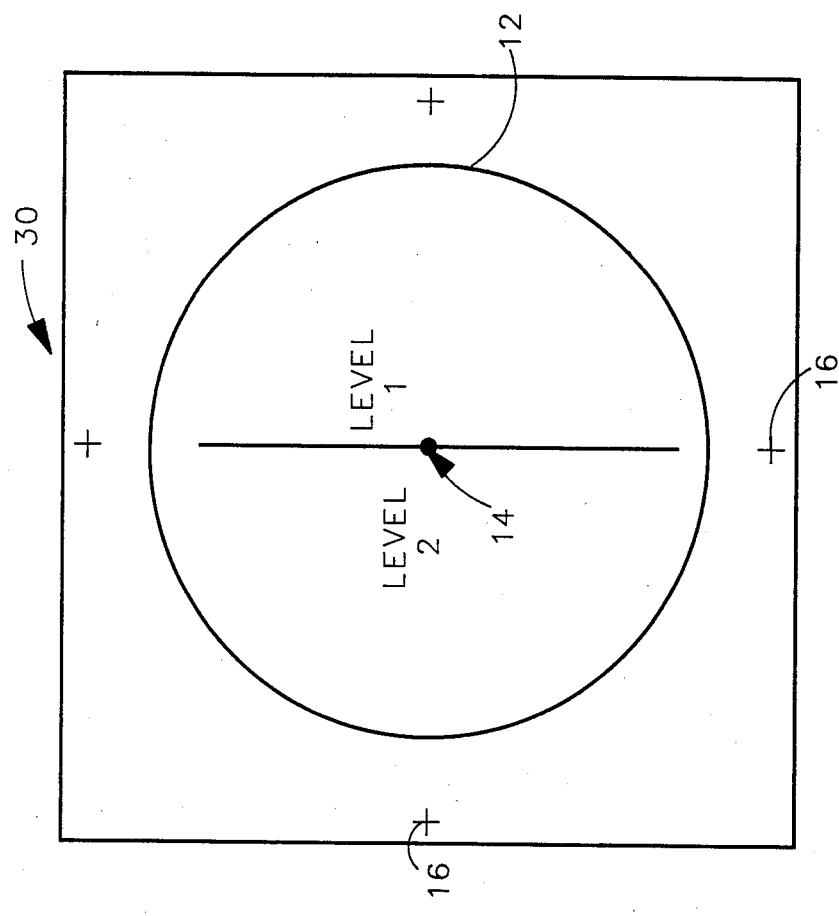
FIG. 3 is a plan view of yet another embodiment of multi-image reticle of this invention.

In FIGS. 1, 2 and 3 there are shown three embodiments of a multi-image reticle of the invention. Each reticle is generally planar and includes a plurality of integrated circuit mask patterns positioned in separate areas on the reticle.

Thus, in FIG. 1 there is shown a multi-image reticle 10 having four different integrated circuit mask patterns thereon. The different mask patterns are denoted as Level 1, Level 2, Level 3, and Level 4. Each integrated circuit mask pattern is positioned in a separate quadrant of the reticle, as illustrated.

The reticle 10 is shown as having a square outer perimeter. The usable lens area 12 when the reticle is placed in a conventional projection stepper apparatus is generally circular and is located in the central portion of the reticle.

Each of the mask patterns in reticle 10 includes the appropriate image patterns for a separate level of circuitry to be produced on a wafer. Thus, the same portion of a wafer may be exposed sequentially to each of the mask patterns in reticle 10, with appropriate conventional film growth or deposition techniques employed between exposures so as to produce the desired integrated circuit on the wafer. The cross-hatchings 16 on the edges of the reticle are for aligning the reticle in the exposure apparatus. For a multi-image reticle these cross-hatchings are symmetrically placed on all four sides of the reticle.

After the reticle 10 has been appropriately placed in the projection stepper apparatus with the mask pattern of Level 1 in the proper position, the pattern of Level 1 is projected onto the wafer. Then when it is desired to project the pattern of Level 2 onto the wafer, the reticle 10 is rotated about its center 14 by 90° so that the pattern of Level 2 is in exactly the same position as Level 1 was for the first projection. Thus, in this manner the pattern of Level 2 is in proper registration with the image formed by Level 1 on the wafer. Then the pattern of Level 2 may be projected onto the wafer, followed by the necessary film growth or deposition for the second level of circuitry on the wafer.

Then the reticle 10 is again rotated by 90° about its center so that Level 3 is in exactly the same position as the pattern of Level 1 was in for the first exposure. Then the pattern of Level 3 is projected onto wafer, after which its image pattern can be developed on the wafer.

Then the reticle 10 is again rotated by 90° about its center so that Level 4 is in exactly the same position as the pattern of Level 1 was in for the first exposure. Then the pattern of Level 4 is projected onto the wafer, after which its image pattern can be developed on the wafer.

Thus, using the techniques described herein, and the novel multi-image reticle, each mask image pattern is projected through the same portion of the lens. This eliminates lens distortion effects on the level overlays. The technique also utilizes a single reticle for multiple image patterns, thereby resulting in cost savings for the production of integrated circuits.

FIG. 2 illustrates another embodiment of a multiimage reticle 20 having three integrated circuit mask patterns thereon, denoted as Level 1, Level 2, and Level 3. This reticle is used in the same manner as reticle 10, except that there are three mask patterns instead of four.

After a wafer has been exposed to the mask pattern of Level 1, the reticle is rotated 90° about its center 14 so as to place the mask pattern of Level 2 in the same position as the pattern of Level 1 was in for the first exposure. Then the reticle is again rotated 90° about its center to place the mask pattern of Level 3 in proper position for exposure onto the wafer.

FIG. 3 illustrates another embodiment of a multiimage reticle 30 having two integrated circuit mask patterns thereon, denoted as Level 1 and Level 2. This reticle is used in the same manner as reticle 10, except that there are two mask patterns instead of four.

After a wafer has been exposed to the mask pattern of Level 1, the reticle is rotated 180° about its center so as to place the mask pattern of Level 2 in the same position as the pattern of Level 1 was in for the first exposure.

Figure 4:
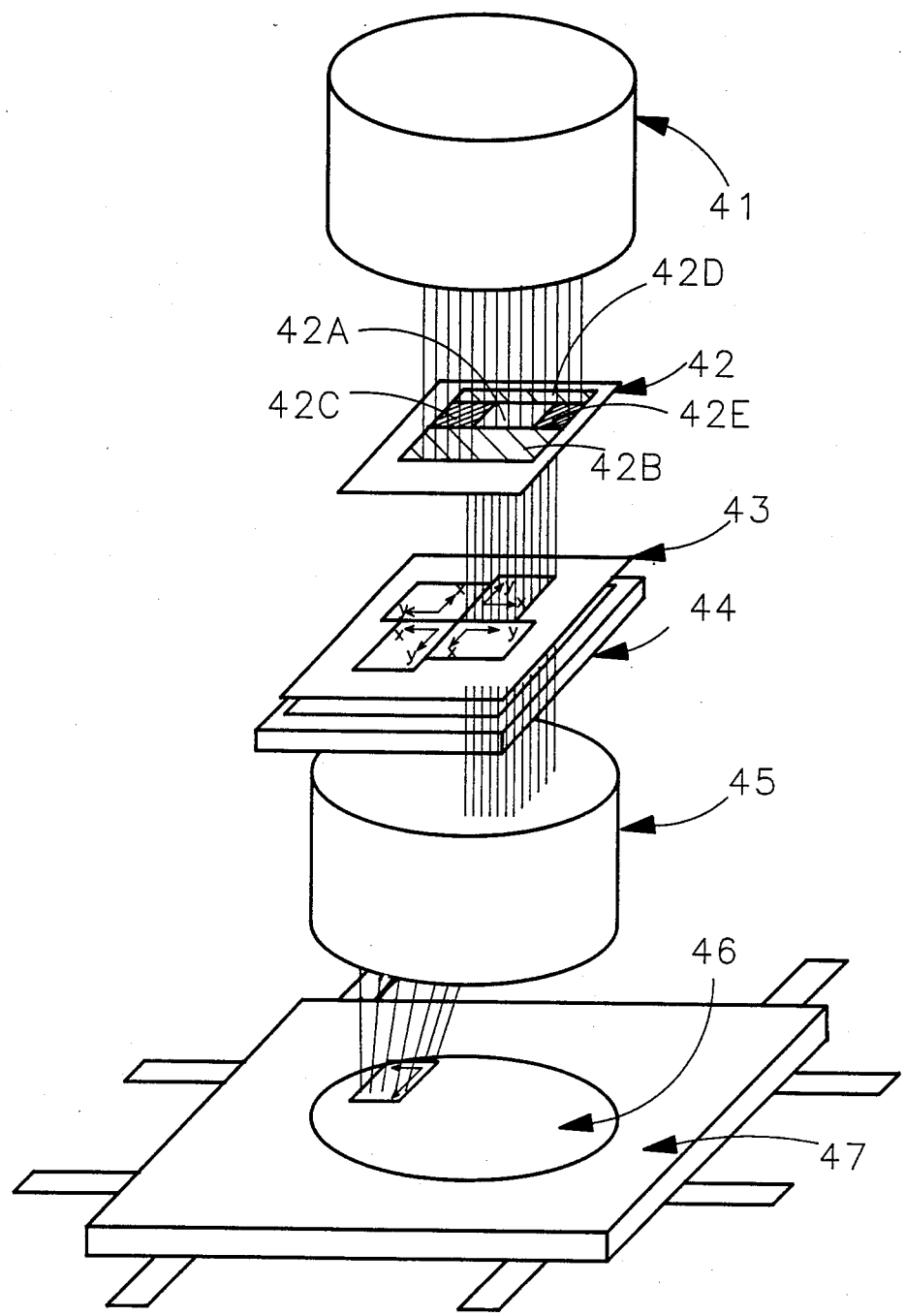
FIG. 4 is an elevational view illustrating the use of the multi-image reticle of the invention.

FIG. 4 illustrates a typical projection of a mask image pattern on a reticle onto a wafer. Thus, there is shown a conventional illuminator 41 which projects light downwardly through the opening 42A in aperture 42. A multilevel reticle 43 is supported on a reticle platen 44 and properly aligned with reference marks on the reticle platen.

The aperture blades 42B, 42C, 42D and 42E are independently adjustable so that the light from the illuminator will only pass through the desired image pattern on the multi-level reticle, as illustrated.

The desired substrate or wafer 46 to be imaged is covered with a photosensitive material. The substrate is then placed on a stepping stage 47 and aligned to reference marks on either the reticle or the optical column 45.

A shutter in the illuminator 41 allows light to pass from the illuminator, through the aperture blade opening, then through the multi-level reticle 43, then through the reduction lens or column 45, and finally onto the wafer 46, as illustrated in the drawing.

Additional images from the reticle are projected onto the same location on the wafer by rotating the reticle 90° so that each image is projected through the same portion of the lens or column 45 onto wafer 46.

What is claimed is:

1. process for imaging a wafer in the production of integrated circuits, said process comprising the steps of:
    (a) providing a single multi-level reticle comprising a multiplicity of integrated circuit mask patterns, wherein said mask patterns are positioned in separate areas on said reticle;
    (b) providing a projection stepper apparatus which is adapted to receive said multi-level reticle and which is further adapted to project light through one of said areas of said reticle;
    (c) inserting said reticle into said stepper apparatus;
    (d) projecting light through one of said areas of said reticle to project a first said mask pattern onto said wafer to form a first image;
    (e) rotating said reticle about its center until a second said mask pattern on said reticle is in registration with said image on said wafer;
    (f) projecting light through said second mask pattern of said reticle to project said second pattern onto said wafer to form a second image in registration with said first image; and
    (g) employing growth techniques between successive exposures to produce the desired integrated circuits on the wafer.

2. A process for imaging a wafer in the production of integrated circuits, said process comprising the steps of:
    (a) providing a single multi-level reticle comprising a multiplicity of integrated circuit mask patterns, wherein said mask patterns are positioned in separate areas on said reticle;
    (b) providing a projection stepper apparatus which is adapted to receive said multi-level reticle and which is further adapted to project light through one of said areas of said reticle;
    (c) inserting said reticle into said stepper apparatus;
    (d) projecting light through one of said areas of said reticle to project a first said mask pattern onto said wafer to form a first image;
    (e) rotating said reticle about its center until a second said mask pattern on said reticle is in registration with said image on said wafer;
    (f) projecting light through said second mask pattern of said reticle to project said second pattern onto said wafer to form a second image in registration with said first image; and
    (g) wherein said multi-level reticle comprises four integrated circuit mask patterns, wherein said patterns are positioned in separate quadrants on said reticle, and wherein said reticle is rotated 90 degrees about its center between each projection onto said wafer.

3. A process for imaging a wafer in the production of integrated circuits, said process comprising the steps of:
    (a) providing a single multi-level reticle comprising a multiplicity of integrated circuit mask patterns, wherein said mask patterns are positioned in separate areas on said reticle;
(b) providing a projection stepper apparatus which is adapted to receive said multi-level reticle and which is further adapted to project light through one of said areas of said reticle;
(c) inserting said reticle into said stepper apparatus;
(d) projecting light through one of said areas of said reticle to project a first said mask pattern onto said wafer to form a first image;
(e) rotating said reticle about its center until a second said mask pattern on said reticle is in registration with said image on said wafer;
(f) projecting light through said second mask pattern of said reticle to project said second pattern onto said wafer to form a second image in registration with said first image;
(g) wherein said multi-level reticle comprises three integrated circuit mask patterns;
(h) wherein said patterns are positioned in separate quadrants on said reticle; and
(i) wherein said reticle is rotated 90 degrees about its center between each projection onto said wafer.

4. A process for imaging a wafer in the production of integrated circuits, said process comprising the steps of:
(a) providing a single multi-level reticle comprising a multiplicity of integrated circuit mask patterns, wherein said mask patterns are positioned in separate areas on said reticle;
(b) providing a projection stepper apparatus which is adapted to receive said multi-level reticle and which is further adapted to project light through one of said areas of said reticle;
(c) inserting said reticle into said stepper apparatus;
(d) projecting light through one of said areas of said reticle to project a first said mask pattern onto said wafer to form a first image;
(e) rotating said reticle about its center until a second said mask pattern on said reticle is in registration with said image on said wafer;
(f) projecting light through said second mask pattern of said reticle to project said second pattern onto said wafer to form a second image in registration with said first image;
(g) wherein said reticle includes two integrated circuit mask patterns; and
(i) wherein said reticle is rotated 180 degrees about its center between each projection onto said wafer.

5. A single reticle adapted for use in a photolithographic system for causing multi-level images to be formed onto a substrate, the reticle comprising:
(a) a plurality of distinct mask patterns positioned in separate areas on the reticle;
(b) each one of said mask patterns corresponding to a separate level of circuitry to be produced at a distinct level onto the substrate; and
(c) the reticle being adapted to be rotated at about its geometrical center for causing the projected multi-level images to be superimposed in general registration with one another.

6. A multi-level reticle in accordance with claim 5, wherein there are two said integrated circuit mask patterns on said reticle.

7. A multi-level reticle in accordance with claim 5, wherein there are three said integrated circuit mask patterns on said reticle.

8. A reticle as defined in claim 5, wherein the photolithographic system includes a projection stepper apparatus.

9. A reticle as defined in claim 5, wherein the reticle has a substantially square outer perimeter.

10. A reticle as defined in claim 9, wherein a general circular usable lens area is defined on the reticle.

11. A reticle as defined in claim 10, wherein said mask patterns are completely disposed within said usable lens area.

12. A reticle as defined in claim 11, wherein said mask patterns are substantially symmetrically disposed within said usable lens area.

13. In a photolithographic system for imaging a wafer in the production of integrated circuits, a single reticle adapted for causing multi-level images to be formed onto the wafer, comprising:
(a) a plurality of distinct mask patterns positioned in separate areas on the reticle;
(b) each one of said mask patterns corresponding to a separate level of circuitry to be produced at a distinct level onto the wafer; and
(c) the reticle being adapted to be rotated at about its geometrical center for causing the projected multi-level images to be superimposed in general registration with one another.

14. A multi-level reticle comprising a multiplicity of integrated circuit mask patterns, wherein said patterns are positioned in separate quadrants on said reticle, wherein said reticle is adapted to be received in a projection stepper apparatus for projection of light through one of said quadrants of said reticle to project a said mask pattern onto a substrate to form an image, and wherein said reticle is adapted to be rotated about its center in 90° steps in a manner such that each of the other of said mask patterns can be projected onto said substrate in registration with said image.

15. A multi-level reticle comprising a multiplicity of integrated circuit mask patterns, wherein said patterns are positioned in separate areas on said reticle, wherein said reticle is adapted to be received in a projection stepper apparatus for projection of light through one of said areas of said reticle to project a said mask pattern onto a substrate to form an image, wherein said reticle is adapted to be rotated about its center in a manner such that each of said mask patterns can be projected onto said substrate in registration with said image, wherein there are four said integrated circuit mask patterns on said reticle, and wherein said patterns are positioned in separate quadrants on said reticle.

* * * * *